United States Patent [19]

Beismann et al.

[11] 4,108,360
[45] Aug. 22, 1978

[54] METHOD OF ERROR ANALYSIS AND DIAGNOSIS IN ELECTRONIC DATA PROCESSING SYSTEMS

[75] Inventors: Walter Beismann, Altdorf; Hans Hermann Lampe, Herrenberg; Werner Pohle, Grafenau, all of Fed. Rep. of Germany

[73] Assignee: International Business Machines Corporation, Armonk, N.Y.

[21] Appl. No.: 834,085

[22] Filed: Sep. 19, 1977

[30] Foreign Application Priority Data

Jan. 12, 1977 [DE] Fed. Rep. of Germany ....... 2654389

[51] Int. Cl.² ............................................ G06F 11/00
[52] U.S. Cl. ................................. 235/304; 235/302.1
[58] Field of Search ...................... 235/304, 304.1, 302, 235/302.1; 364/200, 900

[56] References Cited

U.S. PATENT DOCUMENTS

| | | | |
|---|---|---|---|
| 3,497,685 | 2/1970 | Stafford et al. | 235/302 |
| 3,715,573 | 2/1973 | Vogelsberg | 235/302.1 |
| 3,780,277 | 12/1973 | Armstrong et al. | 235/302.1 |

OTHER PUBLICATIONS

R. W. Downing et al., No. 1 ESS Maintenance Plan, The Bell System Technical Journal, Sep. 1964, pp. 2018-2018.

*Primary Examiner*—Charles E. Atkinson
*Attorney, Agent, or Firm*—Cyril A. Krenzer

[57] ABSTRACT

A method for error analysis and diagnosis uses error images stored in the system from which significant error information is extracted by analyzing the error bytes of the error image. The error information is combined, via tables, with error information extracted from other error bytes and a reference code is generated by the combination by means of which a predetermined error file is addressed, which contains information on the kind of error, its location and information on the remedying of the error.

8 Claims, 3 Drawing Figures

METHOD OF ERROR ANALYSIS AND DIAGNOSIS IN ELECTRONIC DATA PROCESSING SYSTEMS

BACKGROUND OF THE INVENTION

1. Field of the Invention

The invention relates to a method of error analysis and diagnosis in electronic data processing systems, and in particular to the generation of an address or reference code, by means of which a list of the various types of errors, their locations encountered in the electronic data processing system, and where they are stored as a function of error symptoms, can be searched for the probable error and its location.

2. Prior Art

When system errors are automatically analyzed, it is scarcely possible for economical reasons to obtain an absolute reliability. However, at reasonable expenditure it will be in the region of 90%. The remainder, i.e., those errors that cannot be automatically analyzed, is generally diagnosed by experts with the aid of the error symptoms supplied by the error circuits and by means of special test methods.

The analysis data collected during the non-automatic error analysis are included, wherever possible, in the programs for automatic analysis, in order to improve their reliability and efficiency.

The source data required for the automatic analysis of system errors are generally the result of parity or compare checks during which a number of single information bits or signals is combined in the form of a check group of bytes or blocks. As the single information is associated with particular parts of the information processing system, a detailed diagnosis of the defective single information and its error polarity permits accurately determining the error location. The single information which is derived from the various parts of the electronic data processing system by means of the aforementioned check circuits and sensors, can be combined in the form of error image chains. The error images generally consist of several error bytes, which in their turn are made up of several error bits. The error images and error bytes may be structured, although not necessarily so, in such a manner that they provide information on the error situation of a particular part of the system.

Error diagnosis on the basis of the error images is generally accomplished with the aid of an error file in which error type and error location are associated with error images, which somewhat represent the error symptoms of a system. It is also possible to store in the file specific error information, for example, on how an error can best be eliminated.

The error files are generally compiled by the development engineers in the time between development and completion of an electronic data processing system. Errors which could not be taken into consideration or were not anticipated at that stage, but which may be encountered by the customer after he has put the system into operation, cannot subsequently be remedied because of the inflexibility of such error analysis or diagnostic systems. Although it is desirable to gaplessly analyze and diagnose errors throughout the life of an electronic data processing system, known error analysis and diagnostic systems have the disadvantage that they cannot be easily and readily updated.

OBJECTS AND SUMMARY OF THE INVENTION

Therefore, it is the object of the present invention to remedy this situation and to provide a method of error analysis and diagnosis that always permits automatic, semiautomatic or manual diagnosing of all known errors including error situations which become known only after the development of the electronic data processing system is completed.

The foregoing and other objects are accomplished according to one aspect of the invention by a method of error analysis and diagnosis that extracts from the error images stored in the system, significant error information by analyzing the error bytes of the error image. The extracted information is combined via tables with extracted information of other error bytes and an address or reference code is generated as a result by means of which a predetermined error file is addressed, which contains in storage information on the kind of error and its location. If necessary, information on remedying the error can be provided, so the error can be automatically, semiautomatically or manually eliminated.

DESCRIPTION OF THE PREFERRED EMBODIMENT

In electronic data processing systems comprising an efficient network of check circuits (parity check circuits for checking coded information, analog-to-digital circuits for checking voltage, temperature and the like) these error data are combined, as previously mentioned, in the form of error images (symptoms) contained in bit chains and/or bytes.

The task of error diagnosis is to filter from said data the information signifying the type of error, generating from the information thus obtained a unique reference code (address) yielding the analysis result by means of analysis documentation (error file).

During this process, the error information must be examined in a particular sequence for its diagnostic contents as a function of the type of error.

Figure 1:
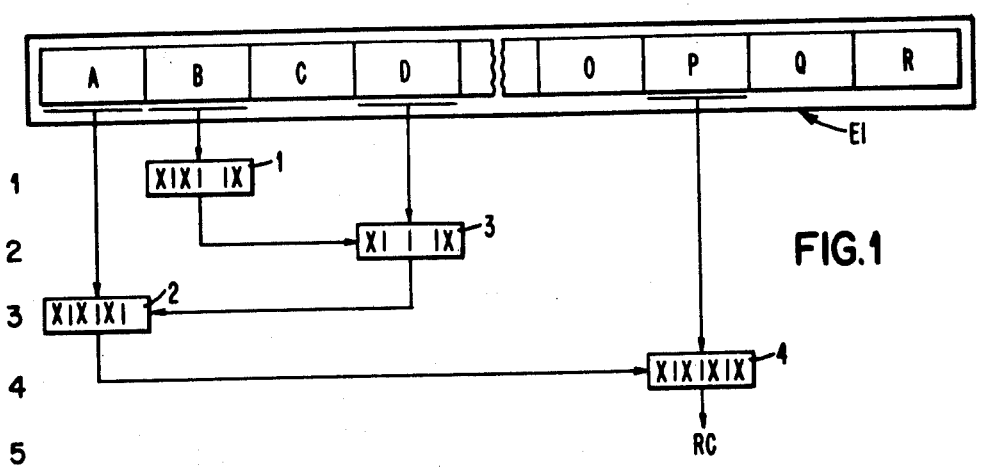
FIG. 1 is a diagrammatic representation of the method steps which are necessary to generate an address (reference code) under which the information on error type and location resulting from the error images is stored in an error file.

The method which is used for this examination is shown, for example, in FIG. 1 depicting an error image EI which is assumed to consist of the error bytes A to R. This error image EI is examined for its diagnostic contents in essentially five typical analytical steps. It may be seen from FIG. 1 that in the example chosen the analysis sequence starts with byte B. Three bits of this byte consisting altogether of four bits are examined for their presence by means of mask 1. It is pointed out in this connection that the particular bits indicated in mask 1 are significant of a particular error to be examined. Other bits are significant of other errors, so that the structure of the respective masks depends upon the type of error to be diagnosed.

The result of the examination of byte B by means of mask 1 is such that in the second step byte D is examined by means of mask 3. Another bit configuration of byte B would most probably influence the analysis sequence in such a manner that in the subsequent step a byte other than B would have to be examined by means of a mask other than 3.

This shows that subsequently, in order to obtain the analysis result reference code, other bytes will have to be examined for their bit structure as a function of the contents of the individual bytes representing the error symptoms. The partial analysis result obtained in the second step causes byte A to be examined by means of mask 2, the result of this examination finally leading to byte P being examined in the fourth step by means of mask 4. In the fifth step it is definite that the last partial analysis result will yield the required reference code RC.

A generalization of this procedure shows that the essential thing is to address the individual error information in the form of bits and bytes of an error image EI, to mask the error information of a byte, in order to reduce the information to the actual significance of the error, and to convert the remaining contents for the purpose of addressing the next byte, thus obtaining the reference code and, by means of the latter, the final analysis result.

Figure 2:
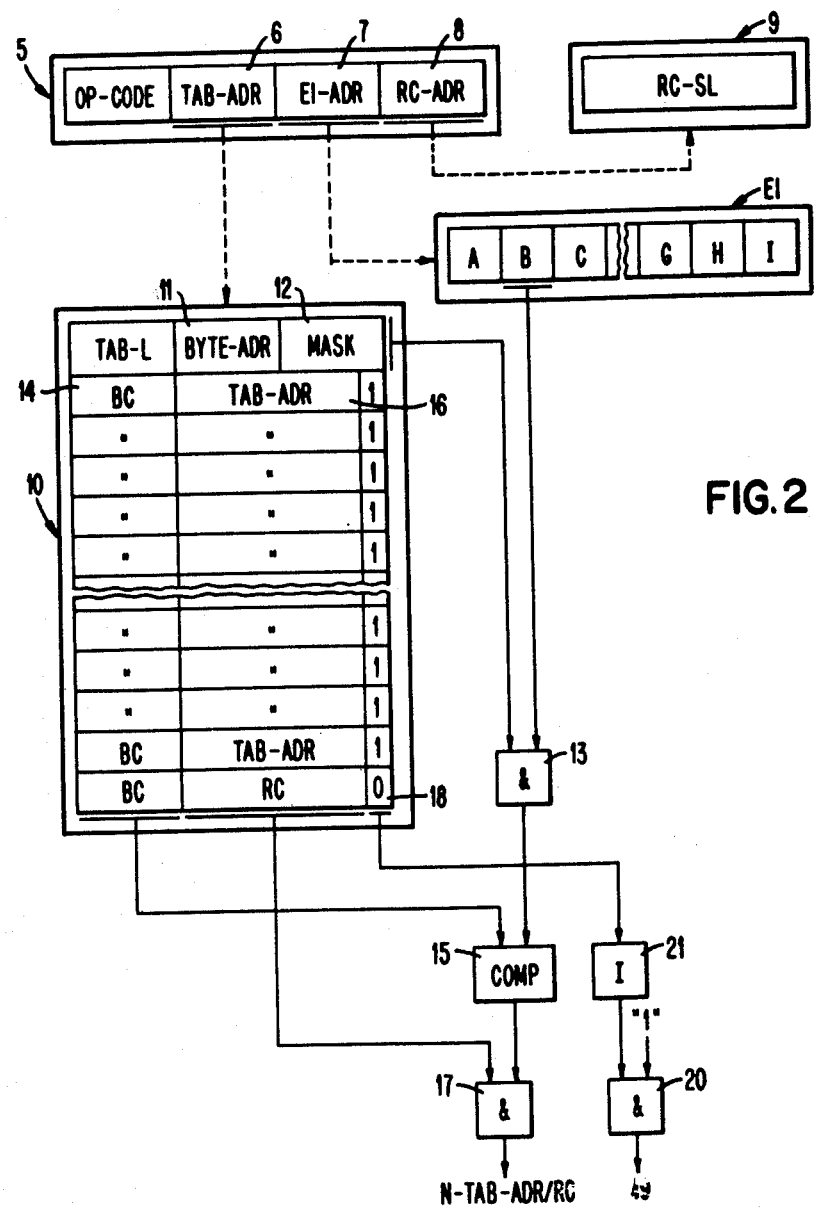
FIG. 2 is a diagrammatic representation showing the method in greater detail.
Figure 3:
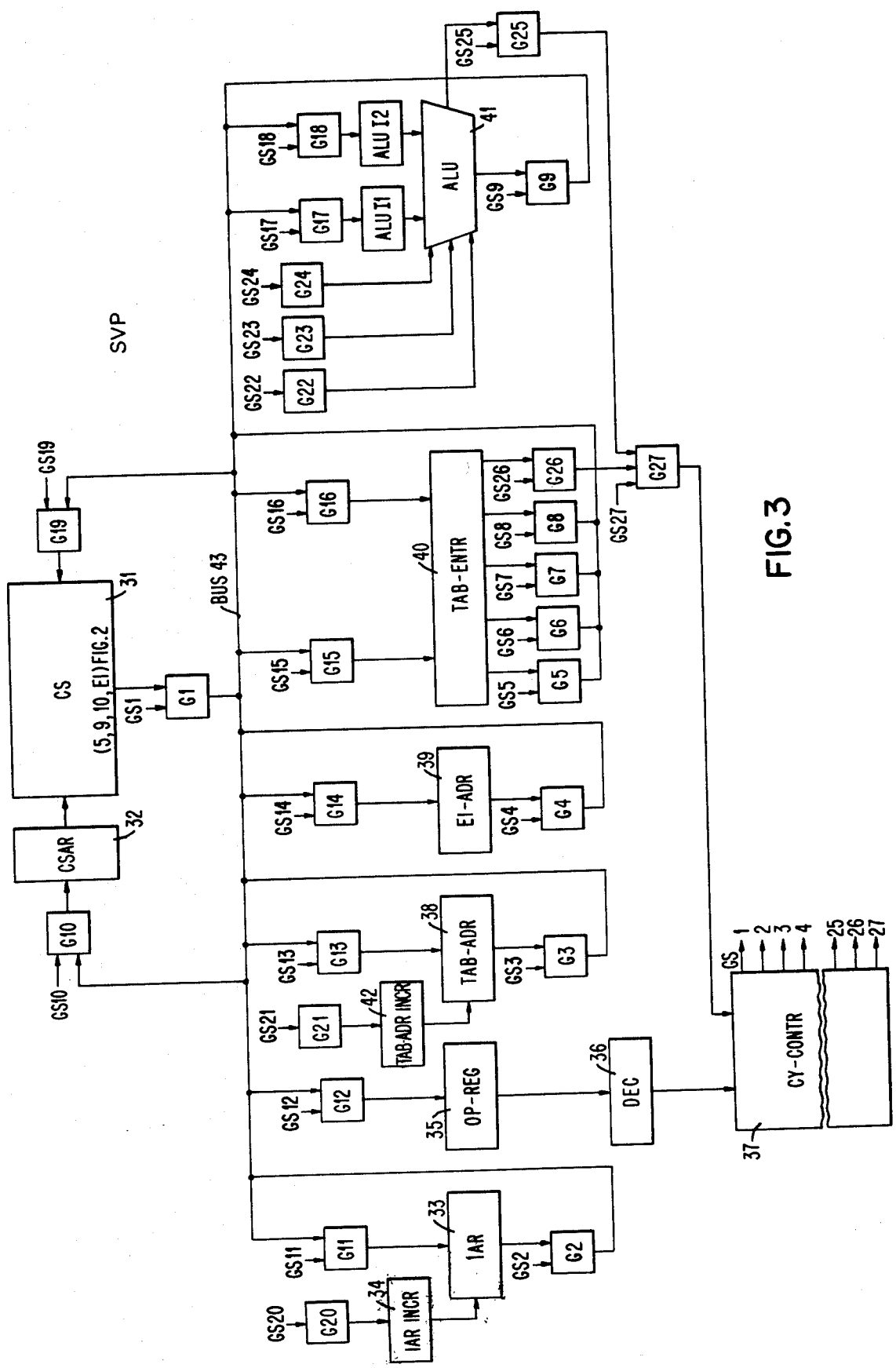
FIG. 3 shows an arrangement, by means of which the method can be implemented.

An arrangement for implementing the method of diagnosis with the aim of generating a reference code is shown in FIGS. 2 and 3, with FIG. 2 depicting the principle and FIG. 3 showing control details.

FIG. 2 shows that the analysis sequence is initiated by a micro instruction 5. The output signal predetermined check circuits causes this first micro incstruction of the analysis routine to be fetched. The analysis routine may be stored in the control store of the central processing unit of a data processing system or in a storage system of a maintenance and service processor serving to load the program and to control the console, if necessary with a display screen, and which is also used for maintenance purposes and error analysis and diagnosis. The approach adopted may be such that each output signal of these predetermined check circuits invariably points at the same first micro instruction of the diagnosis routine. It is also conceivable that each signal points at a micro instruction specific of a check circuit and thus of an error and belonging to routines associated with particular errors. Finally, it may be necessary for economical reasons to use a mixture of the two above-mentioned start procedures.

As is also shown in FIG. 2, the micro instruction has a field for the operation code and three further fields for the table address (TAB-ADR) 6, the error image address (EI-ADR) 7 and the reference code address (RC-ADR) 8. The table address TAB-ADR fetches a particular one out of a number of tables stored, for example, in the storage system of the maintenance and service processor. The error image address EI-ADR selects one out of the many error images EI stored, which in their totality represent the data to be analyzed, hereafter referred to as analysis data, whereby the organization is such that, for example, the first error image serves to determine which of the check circuits provided has selected the error analysis by means of its check circuits, using the first of the above-mentioned tables.

The reference code address RC-ADR finally points at the storage position where the final result reference code is expected.

The relative byte address 11 of the error image EI is fetched from the first table 10 addressed by means of the table address TAB-ADR. With the aid of the mask 12 contained in the table and with the aid of the AND gate 13 the addressed byte is reduced to its significance and is compared with predetermined values of the byte contents (BC) 14 of table 10. In the case of a match of the reduced byte contents and the table value of the byte contents BC, which is established by the comparer (COMP) 15, the table address 16 coupled with BC is fetched to address the next analysis table. To this end the output signal of the comparer 15 controls an AND gate 17 which, if an output signal of comparer 15 is present, emits on its output the table address TAB-ADR, applied to its other input, as address N-TAB-ADR of the next table, or the reference code RC.

These steps are repeated, and the required reference code can be considered found if in the case of a match the two mentioned byte values of the appertaining table address entry are marked as shown in table 10 at 18. Marking is effected by a zero bit in the corresponding column of the table, which is transferred, via an inverter 21, to a further AND gate 20 whose other input invariably receives a "1". The output signal 19 of this AND gate then indicates that a reference code has been found. This reference code, which is also issued via AND gate 17, can then be used to automatically address the error file which specifies the error and, if necessary, specifies for its correction via a suitable output medium, such as a display screen or a printer.

During manual operation, the reference code RC, by indicating, for example, the number of a maintenance manual and a corresponding page, may also be used to show the maintenance personnel where to look for the desired error information.

As is also shown in FIG. 2, table 10 also contains information on the table length TAB-L which serves to safely limit the table if error images do not lead to a table match. This prevents further tables from being searched. Such a match cannot be established, for example, if the designer of the system has not yet recognized a particular error image or if the error image has not been entered into the table for some other reason. The error image address EI-ADR points at the start of the error image whose length is generally not limited. Byte address 11, which is also specified in the table, is the relative address of a byte in the error bit, which thus results from the error image address EI-ADR + Byte-ADR.

FIG. 3 shows in greater detail the operational step sequence and the control of the control unit required for this purpose. If refers to a data processing system which comprises means, such as a maintenance and service processor (SVP), for performing maintenance and service jobs. If an error signal is encountered which in the case of an error is produced by one of the error circuits mentioned, the data processing system, except for the maintenance and service processor, is stopped. The data flow elements of the maintenance and service processor, to the extent to which they are significant for the generation of the reference code, are shown in FIG. 3.

The essential data flow elements of the maintenance and service processor SVP are its control store (CS) 31 with its access mechanism, consisting of the gates G1, G10, G19 as well as of the control store address register (CSAR) 32. This control store is connected to the remaining data flow elements, the instruction address register (IAR) 33, the operation register (OP-REG) 35, the table address register (TAB-ADR) 38, the error image address register (EI-ADR) 39, the table entry register (TAB-ENTR) 40, as well as to the arithmetic and logical unit (ALU) 41 via the bus (BUS). For the outgoing and the incoming traffic the data flow components mentioned and the bus are connected via gate circuits Gi shown in FIG. 3.

Also provided are a decoder (DEC) 36 for decoding the operation codes, an incrementing circuit (IAR INCR) 34 for incrementing the instruction address register 33, an incrementing circuit (TAB-ADR INCR) 42 for incrementing the table address register 38, and finally a cycle control (CY-CONTR) 37 which produces the control signals GS1 to GS26 for the gate circuits G1 to G26 at the appropriate time.

The operation necessary for generating the reference code is essentially performed in 20 operational steps which in their turn are executed in one or several elementary steps. After the generation of the reference code has been initiated, the operation code of the micro instruction is transferred to the operation register 35 in operational step 1, in order to control the generation of the reference code by means of the decoder 36 and the cycle control 37. For this purpose two elementary steps are needed, the first one opening gate G2, so that the storage address for fetching the instruction reaches the bus BUS. Also in the same elementary step 1 the control signal GS10 is produced, leading to gate G10 between the bus and the control store address register 32 being opened, so that the instruction address is transferred from the bus into said register.

In the second elementary step of operational step 1 the gate control signal GS1 is first of all generated, so that the operation code, which at that time is in its assigned field of the micro instruction word in the output register (not shown) of the control store is transferred to the bus BUS. In addition, the gate control signal GS12 is generated, opening the gate between the bus and the operation register 35, so that the operation code is transferred to the operation register 35. By means of the gate control signal GS20 the incrementing circuit 34 is actuated via gate circuit G20, leading to the address in the instruction register 33 being incremented by 1, so that the next sequential micro instruction can be read in the next read cycle of the control store. In the course of the further processing operations the individual fields can be sequentially fetched from the output register of the store.

In the case of the present embodiment, however, another operating mode is used, by means of which each required field of the instruction word (cf. a; FIG. 2) is fetched by separately accessing the control store. Thus in the second operational step the third elementary step (the elementary steps being continuously numbered) effects a further storage access, in order to transfer the table address into the table address register 38. To this end the gate circuit G2 is again opened by means of the gate control signal GS2, transferring the control store address to the bus BUS, whence it is fed via the opened gate G10 into the control store address register 32. By means of this address the table address is read, being transferred in the fourth elementary step into the table address register 38 via gate G1, bus BUS and gate G13. Also in this case the instruction address register 33 has to be incremented, this being done by incrementing circuit 34 in the manner previously described.

In operational step 3 gates G2 and G10 are again actuated, causing the new control store address to be transferred into the control store address register 32 in the fifth elementary step, in order to effect a storage access for reading the error image address. Thus in the sixth elementary step gates G1 and G14 are opened, in order to transfer said error image address into error image address register 39. After this transfer operation, the incrementing circuit 34, which again increments the contents of the instruction address register 33 by "1", is actuated by means of the gate control signal GS20 and the gate circuit G20. Operational step 4 ensures that the first table entry word reaches the table entry register 40. To this end gate G3 is opened in the seventh elementary step by means of the gate control signal GS3, and the table address is transferred from the table address register 38, via the bus and gate G10 opened for this purpose, into the control store address register 32. After reading, the first table entry is transferred in the eighth elementary step to table entry register 40 via gate G1, the bus and gate G15. Also in elementary step 8, incrementing circuit 42 increments the table address in table address register 38 by "1", this process being triggered by gate G21 which in turn is conditioned by gate control signal GS21 of the cycle control 37.

Operational step 5 causes the error image to be addressed by the sum of the error image address and the byte address from the table. For this purpose, the error image address in error image address register 39 is transferred in the ninth elementary step, via gate G4, to the bus and thence, via gate G17, to the first input ALU I1 of the arithmetic and logical unit 41. In the tenth elementary step the contents of the table entry register 40 are transferred via gate G6, bus BUS and gate G18 to the second input ALU I2 of the arithmetic and logical unit 41. The values subsequently available on the two inputs of the arithmetic and logical unit 41 are added, being transferred in the eleventh elementary step to control store address register 32 via gate G9, the bus and gate G10. It is pointed out that the addition operation of the arithmetic and logical unit 41 is triggered by gate control signal GS22 and gate circuit G22.

Operational step 6 serves to mask (select) the bit configuration to be examined in the selected byte of the error image and to store it in input register ALU I2. For this purpose the control store is read in elementary step 12 by means of the address in control store address register 32, which was transferred there in elementary step 11, and the contents of the addressed storage position are fed to the bus via gate G1. By activating gate G18, this information reaches input register ALU I2 of the arithmetic and logical unit 41. This is followed by elementary step 13, by means of which gate G7 on the output of table entry register 40 is opened, so that byte 3 of the table entry word transferred in the eighth elementary step to table entry register 40 is fed to the bus.

This table word consists of three bytes (B1, B2 and B3), of which byte B1 in the respective first word of the table, e.g., table 10, consisting of several words contains the table length TAB-L, whereas byte B2 contains the byte address and byte B3 the compare mask.

In each second and subsequent word of the table, byte B'1 indicates the predetermined value which is to be obtained after the error image bytes in question have been significantly reduced with the aid of masking, and byte B'2 together with byte B'3 indicates the address of the table to be searched next, the last bit of byte B'3 representing the marking previously mentioned which specifies whether a further table is to be searched or whether the address consisting of the bytes B'2 and B'3—with the exception of the last bit position—is the desired reference code.

Also in elementary step 13, gate G17 is opened by means of the control signal GS17 of cycle control 37, so that this byte B3 is transferred from the bus to the input register ALU I1 of the arithmetic and logical unit 41. It is the purpose of elementary step 14 to issue to the arithmetic and logical unit 41, via gate G23, the direct command for ANDing the values stored in their input registers. In the same elementary step, the result of this operation is transferred, via gate G9, to the bus and thence, via gate G18, to the second input register ALU I2 of the arithmetic and logical unit.

In the seventh operational step the second table entry word is transferred. For this purpose it is initially applied to the bus via gate G3 in elementary step 15. From the bus said entry word is fed, via gate G10, to the control store address register 32. In elementary step 16 control store 31 is read, its information, the second table entry word, being transferred to the bus via gate G1. Also in elementary step 16, gate G15 is opened, so that the second table entry word transferred via the bus can reach table entry register 40. In operation, the table address is incremented by the value "1" via gate G21.

In operational step 8 the masked byte of the error image EI is compared with the byte contents BC of the second table entry word. For this purpose byte B'1 in the table entry register 40 is initially transferred in elementary step 17 to the bus by opening gate G5. Then also gate G17 is opened, in order to transfer said byte B'1 in the same elementary step from the bus to the input register ALU I1 of the arithmetic and logical unit 40. Elementary step 18 serves to transfer the compare command to the arithmetic and logical unit via gate G24.

In operational step 9 a decision is taken by checking via gate circuit G25 at clock time GS25 in the nineteenth elementary step whether the result of this comparison is equal or not equal. In the present example it is assumed to be not equal corresponding to a binary "0". This leads to gate G27 continuing to be blocked, whose output would have otherwise induced the cycle control 37 to fetch a new table.

Therefore, the third table entry word is transferred to the table entry register 41 in operational step 10. For this purpose gate G3 is opened in elementary step 20, causing the table address to be fed to the bus. The simultaneous opening of gate G10 causes said address to be transferred to the control store address register. In elementary step 21 control store 31 is read, and the table entry word is transferred via the opened gate G1 to the bus and thence, via the opened gate G15, to the table entry register. In elementary step 21 the table address is again incremented.

Operational step 11 again serves to compare the masked error image byte with the predetermined byte contents BC of the third table entry word. To this end, gate G5 is opened in elementary step 22, causing byte B'1 of the third table entry word to be transferred to the bus and thence, via the opened gate G17, to the input register ALU I1 of the arithmetic and logical unit. In the next elementary step 23 a further compare command is issued to the arithmetic and logical unit via gate G24.

In operational step 12 the result of this comparison is checked, opening gate G25 in elementary step 24, which since a match was found in the arithmetic and logical unit emits on its output a signal corresponding to the binary "1". With gate G26 being open, a binary "1" is sensed in the bit position of byte B'3, which together with the gate control signal GS27 is fed to gate G27, thus generating an output signal which is transferred to cycle control 37. In operational step 13 said cycle control causes the first table entry word of the next table to be transferred to table entry register 40. For this purpose the two bytes B'2 and B'3 are transferred in elementary step 25 to the bus by opening gate G8. From the bus said bytes are fed to the control store address register via the opened gate G10. In the same elementary step this value is transferred via the bus and the opened gate G13 to the table address register 38. In elementary step 26 a storage access takes place, by means of which the first table entry word of the next table is transferred to the bus via the opened gate G1. In addition, said table entry word is transferred, via the opened gate G15, to the table entry register 40, and the table address is incremented in the described manner by means of control signal GS21 (with gate G21 being open).

Operational step 14 serves to address the required error image by means of the sum of the error image and the byte address. Therefore, in elementary step 27, with gate G14 being open, the error image address is transferred to the bus and thence, via the opened gate G17, to the input register ALU I1 of the arithmetic and logical unit 41. In the subsequent elementary step 28 gate G6 is opened, so that byte B'2 containing the byte address is fed to the bus. Also in elementary step 28, gate G18 is opened, so that byte B'2 can be written into the input register ALU I2. This is followed by elementary step 29 in which gate G22 is opened which issues an add command to the arithmetic and logical unit. With gate G9 being open, the result is transferred to the bus and thence, via the opened gate G10, to the control store address register 32.

Then operational step 15 is performed which serves to mask the required byte of the error image and to transfer the mask value to the input register ALU I2 of the arithmetic and logical unit. Therefore, in elementary step 30 the storage is read at the previously addressed position, and the contents of this storage position are transferred, via gate G1, to the bus and thence, via the opened gate G18, to the above-mentioned input register of the arithmetic and logical unit. In the subsequent elementary step 31 byte B3 is transferred, via gate G7, to the bus and thence, via the opened gate G17, to the input register ALU I1. To permit the arithmetic and logical unit to AND the two values stored in its input register, said AND command is applied to it via gate G23 in elementary step 32. Via gate G9 the result is fed to the bus and thence, via gate G18, back into input register ALU I2.

In operational step 16 which follows, the second table entry word is transferred to the table entry register 40, so that the result of the masking operation can be compared with the predetermined byte contents (cf. FIG. 2, comparer 15). This transfer is initiated in the 33rd elementary step by opening gate G3, so that the table addres is applied to the bus, whence it is transferred, via the opened gate G10, to the control store address regiser 32. Elementary step 34 initially causes a storage read operation being performed, so that the contents of the storage at the addressed position, that means the next table entry word, can be fed, via the opened gate G1, the bus and the opened gate G15, to the table entry register 40. As previously mentioned, such an input into the table entry register is followed by the table address in the table address register 38 being incremented, the latter operation being triggered by a control signal GS21.

For comparing the masked error image byte with the predetermined byte contents from the table, operational step 17 is provided which in its elementary step with the consecutive no. 35 opens gate G5, so that byte B1 from the table entry register 40 is transferred via the bus. Gate G17 is also opened, so that byte B1 is transferred from the bus to the input register ALU I1 of the arithmetic and logical unit. The elementary step 36 then serves to issue the compare command to the arithmetic and logical unit via gate G24.

In operation step 18 and the subsequent elementary step 37 the result of the comparison of the arithmetic and logical unit is sensed by opening gate G25. It is assumed that in the present example the result of the comparison supplied by the arithmetic and logical unit is positive. Also in elementary step 37, bit position 7 (cf. 18 in FIG. 2), which in the present case is assumed to contain a binary "0", is sensed via gate G26 with the aid of control signal GS26. This binary "0" in bit position 7 of byte B3 of a second or subsequent table entry word (never the first table entry word of a table) marks a reference code. This causes the reference code to be stored at a control store position specified by the reference code address stored in field 8 of a micro instruction 5 (cf. FIG. 2). Since gate G25 but not gate G26 supplies an output signal, gate G27 is not opened, so that no control signal is applied to the cycle control 37 which, as previously described in connection with operation step 13, caused a new table to be fetched. It is pointed out that when a table is sequentially processed, an error byte BC in the table and a checked error byte of an error image will not be found to match. As in such a case the cycle control 37 will be compelled to fetch a fresh table, the output signal "0" of gate G25 will be directly used to induce the cycle control to fetch a new table, as described, by means of the table address contained in the table entry word concerned.

Instead, the reference code address from the instruction word is transferred to control store address register in operational step 19. For this purpose gate G2 is initially opened in elementary step 38, so that the reference code address from the instruction address register 33 can reach the bus and thence, via the opened gate G10, the control store address register 32. In elementary step 39 a storage access takes place, by means of which the address is transferred to the control store address regiser 32 via gate G1, the bus and the opened gate G10. In addition, the contents of the instruction address register 33 are incremented by "1" via gate G20.

In the last operational step 20 the generated reference code from the table is transferred to the control store and stored at that storage position whose reference code address is contained in the instruction word. To this end gate G8 is opened in element step 40, so that bytes B2 and B3 can reach the bus and, via the opened gate G19, the control store 31.

Subsequently, the control can generate the next reference code, causing the operational cycle to be repeated in 20 operational steps with altogether 40 elementary steps. After the reference code representing the required address of the error file in which all information concerning the kind and location of the error and, if necessary, information concerning its elimination has been generated, the necessary measures for eliminating the error can be initiated either automatically or manually.

The information stored in the error file is determined by the designers during the design of the system in order to facilitate its maintenance and servicing. Further information or data resulting from the operation of the system is stored in the error file. In this manner errors in the data processing system concerned can be most favorably analyzed and diagnosed.

While the invention has been described in the context of the preferred embodiment thereof, it will be readily apparent in those skilled in the art that various changes and modifications can be made within the present teaching. It is, therefore, intended that the invention is not to be limited to the specifics of the above-described embodiment, but rather is to embrace the full scope of the following claims.

We claim:

1. A method for error analysis and diagnosis in electronic data processing systems wherein the system includes in storage a plurality of predefined error images, said method comprising:
   extracting significant error information from a first error image by analyzing the error bytes of said error image;
   extracting significant error information from at least a second error image by analyzing the error bytes of said second error image;
   combining the significant error information from the error bytes of said error images to generate therefrom the address of a predetermined error file; and
   addressing said error file to identify the kind of error and its location.

2. The invention according to claim 1 wherein said error file also contains information on the remedying of said error, whereby said error can be automatically, semiautomatically or manually eliminated.

3. The invention according to claim 1 wherein the error bytes of said error images are analyzed using stored masks which are operative to filter out non-significant bits of an error byte.

4. The invention according to claim 3 wherein said significant error information is combined via tables associated with said system operative to compare with one of a plurality of stored, predetermined error significant bits associated with an address and a marker bit, whereby if a positive comparison results, the associated address is the required error file address and if a negative comparison results, further predetermined error significant bits are used for a further comparison.

5. The invention according to claim 3 wherein the address of the error byte to be checked, the mask, the predetermined error significant bits and their associated address, and the marker bit are stored in the form of a table in the system storage.

6. The invention according to claim 5 wherein each table comprises a plurality of table entry words each consisting of three bytes.

7. The invention according to claim 6 wherein the first table entry word of each table has its first byte indicating the table length, the second byte indicates the error byte address and the third byte indicates the mask.

8. The invention according to claim 7 wherein for the second and all subsequent table entry words of a table, the first byte indicates the predetermined significant bits, the second byte indicates the address of the next table, the third byte indicates the required error file address and the last bit of the third byte is the marker bit.

* * * * *